(12) United States Patent
Nezu et al.

(10) Patent No.: US 6,382,174 B1
(45) Date of Patent: May 7, 2002

(54) ARRANGEMENT FOR MOUNTING ELECTRONIC CONTROL UNIT IN ENGINE ROOM

(75) Inventors: Hajime Nezu; Shinobu Uno; Akira Nakagomi, all of Fujisawa (JP)

(73) Assignee: Isuzu Motors Limited, Tokyo (JP)

( * ) Notice: Subject to any disclaimer, the term of this patent is extended or adjusted under 35 U.S.C. 154(b) by 0 days.

(21) Appl. No.: 09/579,356

(22) Filed: May 26, 2000

(30) Foreign Application Priority Data

Jun. 2, 1999 (JP) .......................... 11-154867

(51) Int. Cl.$^7$ ................................ F02B 77/00
(52) U.S. Cl. ................................. 123/198 E
(58) Field of Search ................ 123/198 E, 184.21, 123/143 C, 195 E, 195 C, 41.31

(56) References Cited

U.S. PATENT DOCUMENTS

| | | | |
|---|---|---|---|
| 4,512,314 A | * 4/1985 | Sakamoto et al. ......... | 123/459 |
| 5,163,394 A | * 11/1992 | Koishikawa et al. ... | 123/196 W |
| 5,410,999 A | * 5/1995 | Gillespie et al. ............ | 123/403 |
| 5,713,322 A | 2/1998 | Mausner et al. ....... | 123/184.21 |

\* cited by examiner

Primary Examiner—Marguerite McMahon
Assistant Examiner—Hyder Ali
(74) Attorney, Agent, or Firm—McCormick, Paulding & Huber LLP

(57) ABSTRACT

An arrangement for supporting an electronic control unit (1) on an internal combustion engine. The electronic control unit is provided to bridge a part (7) of an engine main body assembly (6) and a part (9) of an air intake assembly (11). The part of the air intake assembly (11) is preferably an intake air pipe (9). The part of the engine main body assembly (6) is preferably a head cover (7). Therefore, the weight of the electronic control unit (1) is partly supported by the head cover (7) of which rigidity is high. The electronic control unit (1) is inclined towards the head cover (7) so that a larger ratio of the weight of the electronic control unit is supported by the head cover.

13 Claims, 3 Drawing Sheets

ARRANGEMENT FOR MOUNTING ELECTRONIC CONTROL UNIT IN ENGINE ROOM

BACKGROUND OF THE INVENTION

1. Field of the Invention

The present invention relates to an arrangement for mounting an electronic control unit on an internal combustion engine.

2. Description of the Related Art

Conventionally, an electronic control unit adapted to control a fuel injection system for an engine, a turbocharger or an EGR (exhaust gas recirculation) unit is located in a passenger compartment.

In recent years, however, the electronic control unit is often located in an engine room because it is preferred in terms of layout. One example of such layout is disclosed in Japanese Patent Application Laid-Open Publication No. 7-293269 published on Jul. 11, 1995; the electronic control unit is mounted on an intake air pipe. Another example is found in Japanese Utility Model Application Laid-Open Publication No. 63-113764 published on Jul. 22, 1988; the electronic control unit is attached to a throttle body fitted in the intake air pipe.

Since the vicinity of the intake air pipe is not a severe environment thermally, mounting the electronic control unit on the intake air pipe is appropriate.

However, the intake air pipe does not have high rigidity so that it is not an optimum element for supporting the electronic control unit. In particular, when an intake manifold is manufactured from resin to reduce a total weight of the engine and the electronic control unit is mounted on the intake air pipe, the weight of the electronic control unit is supported on the intake manifold via the intake air pipe. The intake manifold having relatively low rigidity cannot bear such weight and therefore it deforms. Further, when the EGR valve or PCV (positive crankcase ventilation) is attached to the intake air pipe, additional weights act on the intake manifold.

SUMMARY OF THE INVENTION

An object of the present invention is to overcome the above described problems.

According to one aspect of the present invention, there is provided an arrangement for supporting an electronic control unit in an engine room (more specifically, on an internal combustion engine), characterized in that the electronic control unit is provided to bridge a part of an engine main body assembly and a part of air intake assembly. The engine main body assembly may include a head cover, a cylinder head, and a cylinder block, and preferably the part of the engine main body assembly is the head cover. The air intake assembly may include an intake manifold and an intake air pipe, and preferably the part of the air intake assembly is the intake air pipe. Therefore, the weight of the electronic control unit is partly supported by the engine main body assembly of which rigidity is high.

Preferably, the electronic control unit is inclined towards the engine main body assembly so that a larger ratio of the weight of the electronic control unit is supported by the engine main body assembly.

Preferably, a frame-like bracket may be provided to span the part of the engine main body assembly and the part of the air intake assembly, and the electronic control unit may be located on the frame-like bracket.

DETAILED DESCRIPTION OF THE INVENTION

Now, an embodiment of the present invention will be described in reference to the accompanying drawings.

Figure 1:
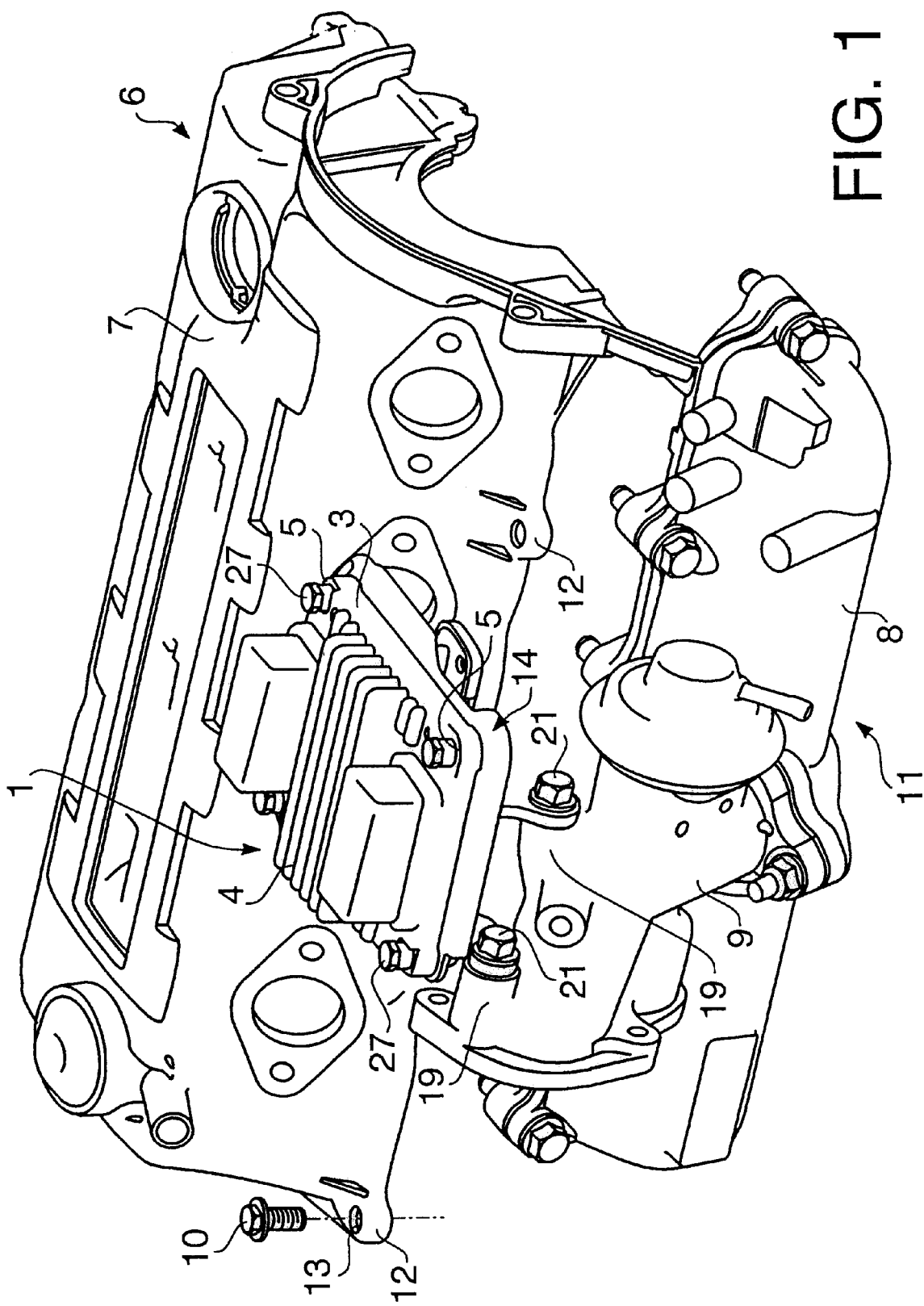
FIG. 1 illustrates a perspective view of an arrangement for supporting an electronic control unit of an engine according to the present invention.

Referring to FIG. 1, illustrated is an electronic control unit 1 (referred to as ECM (engine control module or electronics control module)) designed to control an engine and mounted in an engine room. The ECM unit 1 has a support base 3 integrally. The support base 3 is a thin-plate like element of rectangular shape. A number of radiation fins 4 are formed on an upper face of the support base 3. The support base 3 also has four bolt holes 5 at four corners respectively.

A cylinder block (not shown), a cylinder head 2 (FIG. 2), and a head cover 7 are collectively referred to as an engine main body assembly 6 in this particular embodiment. An intake manifold 8 is attached to a lateral face of the cylinder head 2 for feeding an air into a plurality of combustion chambers (not shown). A downstream end of an intake air pipe 9 is fixed to an upper portion of the intake manifold 8 for introducing the air into the intake manifold 8. The intake manifold 8 and intake air pipe 9 are collectively referred to as an air intake assembly 11 in this embodiment.

A plurality of bosses 12 having a plurality of bolt holes 13 respectively for reception of bolts 10 to secure the head cover 7 onto the cylinder head 2 are formed at predetermined positions along the periphery of the head cover 7.

The present invention is characterized in that the ECM unit 1 spans a part of the engine main body assembly 6 and a part of the air intake assembly 11. Specifically, the ECM unit 1 is placed on a frame-like mount bracket 14 bridging the head cover 7 and intake air pipe 9. The head cover 7 is a part of the engine main body assembly 6 and the intake air pipe 9 is a part of the air intake assembly 11.

Figure 3A:
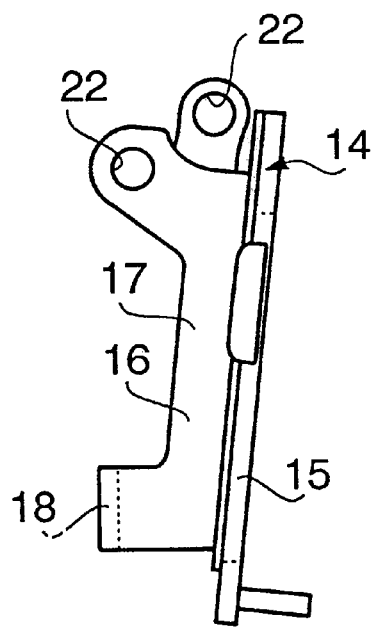
FIG. 3A illustrates a lateral view of a frame-like bracket (mount bracket) used in the supporting arrangement shown in FIG. 1.
Figure 3B:
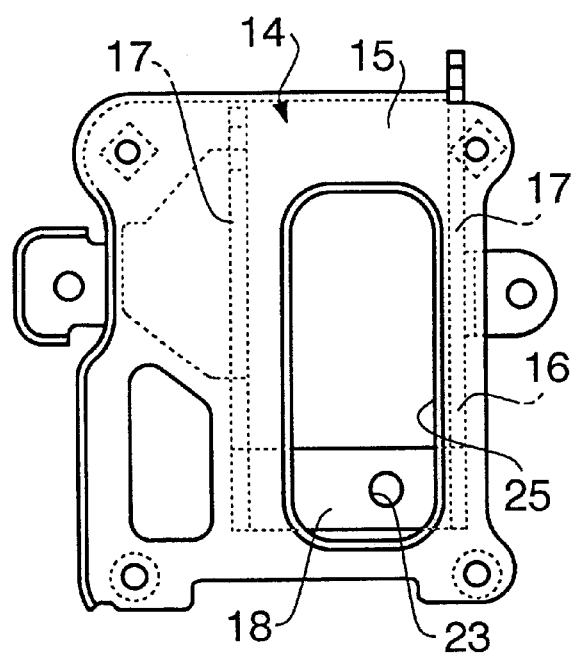
FIG. 3B illustrates a plan view of the bracket.
Figure 3C:
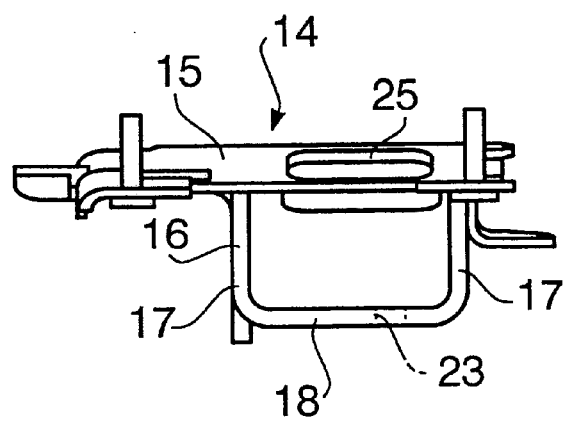
FIG. 3C illustrates a front view of the bracket.

Referring to FIGS. 3A to 3C, the mount bracket 14 includes a flat plate portion 15, on which the ECM unit 1 is placed, and a pedestal 16 attached to a lower face of the plate portion 15. The right side in FIG. 3A becomes an upper side when the ECM unit 1 is mounted, and the upper side in FIG. 3A becomes a space for the intake air pipe 9 when the ECM unit 1 is mounted. The lower side in FIG. 3A is a space for the head cover 7. Likewise, the upper side in FIG. 3B is a space for the intake air 9 when the ECM unit 1 is mounted, and the lower side in FIG. 3B is a space for the head cover 7. FIG. 3C is an illustration viewed from the head cover side, and the upper side in FIG. 3C becomes an upper side when the ECM unit 1 is mounted.

As illustrated in FIG. 3B, the pedestal 16 includes a pair of parallel walls 17 and a connection 18 spanning the parallel walls 17, and therefore has a U shape when observed in the plan view.

The side walls 17 extend such that they bridge the intake air pipe 9 and head cover 7. Each of the side walls 17 has a bolt hole 22 near a free end thereof. The connecting element 18 connects the other ends of the side walls 17 respectively. Specifically, as shown in FIG. 3C, the connecting element 18 bridges the lower edges of the side walls 17. Therefore, the parallel side walls 17 and the connecting element 18 form a U shape when observed in the front view.

The connecting element 18 is placed on one of the bosses 12 (12a) of the head cover 7 (will be described). The connecting element 18 has a bolt hole 23, and the plate member 15 has an opening 25 for service man above the bolt hole 23 such that a service man can insert a tool from the above.

Now, mounting of the ECM unit 1 will be described.

Figure 2:
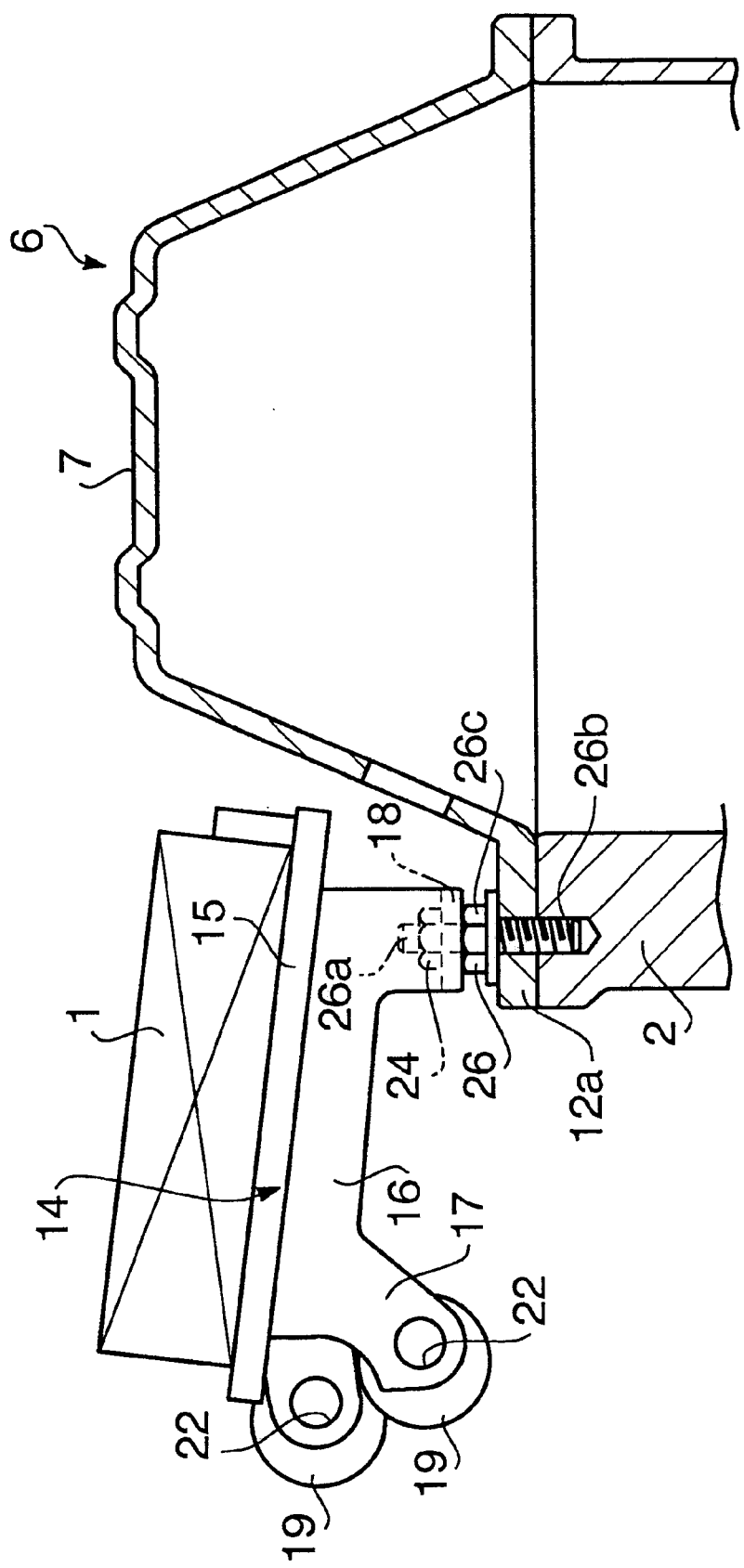
FIG. 2 illustrates a sectional view of the supporting portion for the electronic control unit.

Before mounting the ECM unit 1, the head cover 7 is secured on the cylinder head 2 by the bolts 10. At this point, as illustrated in FIG. 2, a special bolt 26 different from other ordinary bolts 10 is screwed into one of the bosses 12a at a mid position in the longitudinal direction of the head cover 7. This special bolt 26 includes a hexagonal portion 26c over which a tool is engaged, and a pair of threads 26a and 26b extending upwards and downwards respectively from the hexagonal portion 26c. Accordingly, when the head cover 7 is mounted on the cylinder head 2, the thread 26a projects upwards from the center boss 12a.

Next, the mount bracket 14 is attached. First, the bolt hole 23 of the connecting element 18 is received on the thread shaft 26a of the bolt 26. Then, a nut 24 is tightened thereon such that the mount bracket 14 is secured on the head cover 7. At this point, since the flat plate member 15 has the service hole 25, it is possible to insert a tool from the above so that a service man can tighten the nut 24 easily.

The bolt holes 22 of the side walls 17 are aligned to bolt holes (not shown) at bosses 19 of the intake air pipe 9, and bolts 21 (FIG. 1) are threaded into the bolt holes 22 respectively.

Finally, the support base 3 of the ECM unit 1 is placed on the mount bracket 14, and fixed by four bolts 27 screwed at the four corners of the mount bracket 14. At this point, since the flat plate member 15 of the mount bracket 14 slightly inclines towards the head cover 7 as best seen in FIG. 2. As a result, the ECM unit 1 is tilted in the same manner.

Since the ECM unit 1 spans the engine main body assembly 6 (head cover 7) and the air intake assembly 11 (intake air pipe 9), the weight of the ECM unit 1 is born by the intake air pipe 9 and the head cover 7. Accordingly, the weight supported by the intake air pipe 9 is reduced as compared with the conventional arrangement that supports the whole weight of the electronic control unit by the intake pipe or intake manifold. Therefore, even if the intake manifold is fabricated from resin with relatively low rigidity, the deformation of the intake manifold is prevented. The head cover 7 possess high rigidity.

In addition, the ECM unit 1 is lowered (inclined) on the head cover side so that a larger ratio of weight is supported by the head cover 7 as best understood from FIG. 2. In other words, the weight on the intake air pipe 9 is further reduced.

Because the mount bracket 14 has the pedestal 16 made of side walls 17 and connecting element 18, stability of the ECM unit 1 secured on such mount bracket 14 is improved. Further, a bending stress does not act on the ECM unit 1 directly. Moreover, vibration from the engine main body assembly 6 to the ECM unit 1 is reduced.

Since the special bolt 26 having the upper and lower threads 26a and 26b is utilized to secure the mount bracket 14 and head cover 7, it is possible for a service man to attach the mount bracket 14 after fixing the head cover 7 onto the cylinder head 2. This improves serviceability.

It should be noted that although the ECM unit 1 bridges the head cover 7 and intake air pipe 9 in the illustrated embodiment, the present invention is not limited to this structure as long as the ECM unit 1 spans the engine main body assembly 6 and air intake assembly 11. For example, the ECM unit 1 may be arranged such that it extends from the head cover 7 to the intake manifold 8.

However, it should be recalled that the ECM unit 1 is preferably located a high position apart from the engine. By locating so, the ECM unit 1 is less influenced by heat from the engine, a fan can blow a larger amount of cooling air to the ECM unit 1, and a larger space is left for a service man.

Accordingly, it is preferred to provide the mount bracket 14 such that it bridges the intake air pipe 9 projecting upwards from the intake manifold 8 and the head cover 7 situated at the highest position among the engine main body assembly 6, and to provide the ECM unit 1 on such mount bracket 14. By doing so, the size of mount bracket 14 can be made minimum. This also contributes to reduction of weight acting on the intake air pipe 9 (or the intake manifold 8).

The illustrated and described arrangement is disclosed in Japanese Patent Application No. 11-154867 filed on Jun. 2, 1999, the instant application claims priority of this Japanese Patent Application, and the entire disclosure thereof is incorporated herein by reference.

What is claimed is:

1. An arrangement for supporting an electronic control unit on an internal combustion engine comprising:
    an engine main body assembly consisting of a cylinder block, a cylinder head, and a cylinder head cover;
    an air intake assembly attached to the engine main body assembly for introducing an air into the engine; and
    an electronic control unit bridging a part of the engine main body assembly and a part of the air intake assembly so that the weight of the electronic control unit is born by both the air intake assembly and the engine main body assembly.

2. The arrangement according to claim 1, wherein the part of the engine main body assembly is a head cover, and the part of the air intake assembly is an intake air pipe.

3. The arrangement according to claim 1, wherein the electronic control unit is inclined towards the engine main body assembly.

4. The arrangement according to claim 2, wherein the electronic control unit is inclined towards the engine main body assembly.

5. The arrangement according to claim 1 further including a bracket extending from the part of the air intake assembly to the part of the engine main body assembly, and wherein the electronic control unit is placed on the bracket.

6. The arrangement according to claim 2 further including a bracket extending from the part of the air intake assembly to the part of the engine main body assembly, and wherein the electronic control unit is placed on the bracket.

7. The arrangement according to claim 3 further including a bracket extending from the part of the air intake assembly to the part of the engine main body assembly so as to define a down slope on its upper surface, and wherein the electronic control unit is placed on the down slope surface of the bracket.

8. The arrangement according to claim 4 further including a bracket extending from the part of the air intake assembly to the part of the engine main body assembly so as to define a down slope on its upper surface, and wherein the electronic control unit is placed on the down slope surface of the bracket.

9. The arrangement according to claim 5, wherein the bracket has a flat plate member on which the electronic control unit is placed, and a pedestal member including side walls and connecting element.

10. The arrangement according to claim 6, wherein the bracket has a flat plate member on which the electronic control unit is placed, and a pedestal member including side walls and connecting element.

11. The arrangement according to claim 7, wherein the bracket has a flat plate member on which the electronic control unit is placed, and a pedestal member including side walls and connecting element.

12. The arrangement according to claim 8, wherein the bracket has a flat plate member on which the electronic control unit is placed, and a pedestal member including side walls and connecting element.

13. The arrangement according to claim 2 further including a bolt for securing the head cover onto a cylinder head, and wherein the bolt has upper and lower threads such that the lower thread is screwed into the cylinder head when the head cover is fixed on the cylinder head and the upper thread projects from the head cover when the head cover is fixed on the cylinder head.

* * * * *